United States Patent
Mijares et al.

(10) Patent No.: US 11,428,735 B1
(45) Date of Patent: Aug. 30, 2022

(54) SYSTEM FOR MONITORING AND CONTROLLING AN INTEGRATED CIRCUIT TESTING MACHINE

(71) Applicant: Maxim Integrated Products, Inc., San Jose, CA (US)

(72) Inventors: Ruel Jucoy Mijares, Cabuyao (PH); Viren Khandekar, Flower Mound, TX (US); Edson Macgregor Arca Leano, Mulawin Tanza (PH); Hilario Sanchez Jacala, Paranaque (PH)

(73) Assignee: Maxim Integrated Products, Inc., San Jose, CA (US)

( * ) Notice: Subject to any disclaimer, the term of this patent is extended or adjusted under 35 U.S.C. 154(b) by 238 days.

(21) Appl. No.: 16/817,564

(22) Filed: Mar. 12, 2020

Related U.S. Application Data

(60) Provisional application No. 62/818,684, filed on Mar. 14, 2019.

(51) Int. Cl.
*G01R 31/30* (2006.01)
*G01R 31/307* (2006.01)
*G01R 1/04* (2006.01)

(52) U.S. Cl.
CPC ......... *G01R 31/307* (2013.01); *G01R 1/0491* (2013.01)

(58) Field of Classification Search
None
See application file for complete search history.

(56) References Cited

U.S. PATENT DOCUMENTS

| | | | |
|---|---|---|---|
| 5,965,819 A * | 10/1999 | Piety | G01N 29/44 702/56 |
| 6,791,098 B2 | 9/2004 | Pletner et al. | |
| 7,627,441 B2 * | 12/2009 | Longsdorf | G05B 23/027 702/56 |
| 2004/0034483 A1 * | 2/2004 | Sonnichsen | G01M 13/028 702/56 |
| 2008/0234964 A1 * | 9/2008 | Miyasaka | F16C 19/527 702/113 |
| 2020/0182684 A1 * | 6/2020 | Yoskovitz | G01N 29/14 |

FOREIGN PATENT DOCUMENTS

| | | | |
|---|---|---|---|
| CN | 201983916 U | 9/2011 | |
| EP | 2 614 763 B1 | 7/2013 | |
| EP | 2185984 B1 * | 10/2016 | G01H 1/00 |
| WO | WO-2018198111 A1 * | 11/2018 | G05B 23/0283 |

OTHER PUBLICATIONS

Wide Bandwidth, Low Noise, Triaxial Vibration Sensor ADcmXL3021, Analog Devices, 2019.

* cited by examiner

*Primary Examiner* — Jermele M Hollington
(74) *Attorney, Agent, or Firm* — TIPS Group

(57) ABSTRACT

A system for monitoring and controlling an IC testing machine includes a vibration sensor, a sensor interface, and a processor coupled to the sensor interface. The vibration sensor is in mechanical communication with an IC testing machine to develop an electrical vibration signal representing mechanical vibrations generated by the operation of the IC testing machine. The sensor interface processes the vibration signal to develop vibration data that can be processed by the processor to determine whether the vibration data is indicative of an operational anomaly and, if so, to generate a machine control signal to correct an operation of the IC testing machine. Multiple vibration sensors can be used to increase the amount of vibration data available for analysis.

17 Claims, 4 Drawing Sheets

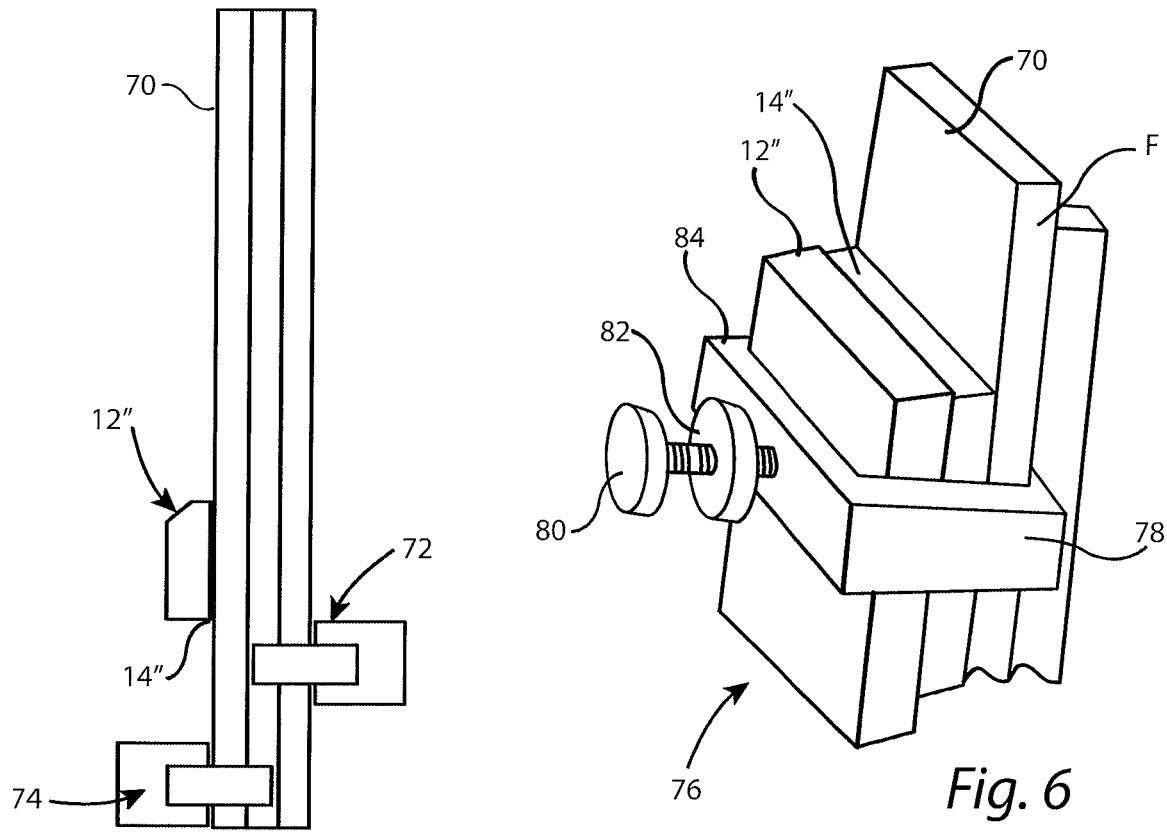
Fig. 5
Fig. 6
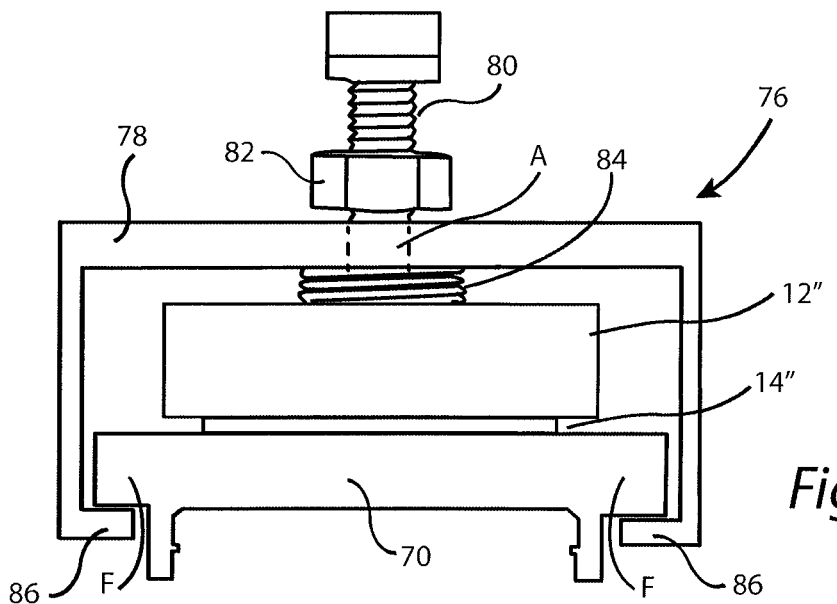
Fig. 7

SYSTEM FOR MONITORING AND CONTROLLING AN INTEGRATED CIRCUIT TESTING MACHINE

CROSS REFERENCE TO RELATED APPLICATIONS

This application claims the benefit of U.S. Prov. Pat. Appl. No. 62/818,684, filed Mar. 14, 2019, incorporated herein by reference.

BACKGROUND

Existing integrated circuit testing machines include a handler apparatus ("handler") that serially feeds packaged semiconductor devices ("units" or "integrated circuits" or "ICs") into a tester portion ("tester") of the machine. The handler manages the fast flow of parts in a serial manner so that the tester output can be maximized. Typical run-rate of such setups ranges in the 1000-3000 units per hour. Units are handled with mechanical precision by robots, linear actuators, relays, levers etc. Any anomaly in the precision handling can cause mishandling of the units (misalignment, jams etc.) that can result in die or package cracks or damage in the units. This can be the biggest customer quality issue, as "Test" is typically the last step before parts are shipped to the customer, and such damage can go undetected.

Condition monitoring is the process of monitoring a parameter of condition in machinery (vibration, temperature etc.), in order to identify a significant change which is indicative of a developing fault. It is a major component of predictive maintenance. The use of condition monitoring allows maintenance to be scheduled, or other actions to be taken to prevent consequential damages and avoid its consequences.

Prior art condition monitoring techniques are normally used on rotating equipment, auxiliary systems and other machinery (compressors, pumps, electric motors, internal combustion engines, presses), and not with the robots, linear actuators, relays, levers, linear actuators, etc. of handlers. As noted above, prior art condition monitoring is predictive in nature and are not designed to detect a critical anomaly in the operation of a machine. Furthermore, condition monitoring is not used for the automatic control or shutdown of a machine.

Accelerometers can be used as vibration sensors. An accelerometer measures proper acceleration, which is the acceleration, i.e. the rate of change of velocity, of a body in its own instantaneous rest frame, as opposed to coordinate acceleration within a fixed coordinate system. Micromachined microelectromechanical systems (MEMS) accelerometers are available from a number of manufactures including Analog Devices, MEMSIC, and Silicon Designs. Single- and multi-axis models of accelerometer are available to detect magnitude and direction of the proper acceleration.

Most micromechanical accelerometers operate in-plane, that is, they are designed to be sensitive only to a direction in the plane of the die. By integrating two devices perpendicularly on a single die a two-axis accelerometer can be made. By adding another out-of-plane device, three axes can be measured.

Accelerometers have been used in condition monitoring apparatus. For example, Machine Saver, Inc. of Houston, Tex. makes vibration monitors using accelerometers that are used for predictive maintenance of machinery. Machine Saver recommends that its vibration modules are to be firmly attached to the machine or motor as close as possible to the centerline of bearings being monitored. This is often accomplished with the use of a powerful magnet rigidly coupling the monitoring apparatus to a magnetic mounting surface of the machine.

The prior art does not disclose real-time detection of malfunctioning integrated circuit testing machines, and therefore exposes integrated circuit manufacturers to unacceptable levels of damaged or poor-quality ICs being shipped to customers. The prior art also does not disclose an integrated circuit testing machine which can be automatically controlled and/or shut down when critical anomalies in its operation are detected by vibration analysis of a handler.

These and other limitations of the prior art will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 5 is an illustration of an example vibration sensor mechanically coupled to a surface of a handler track by an elastomeric layer;

FIG. 6 is a perspective view of an example clamp, vibration sensor and elastomeric layer attached to a handler track; and FIG. 7 is an elevational view of the clamp, vibration sensor and elastomeric layer of FIG. 6.

DETAILED DESCRIPTION OF EXAMPLE EMBODIMENT(S)

Figure 1:
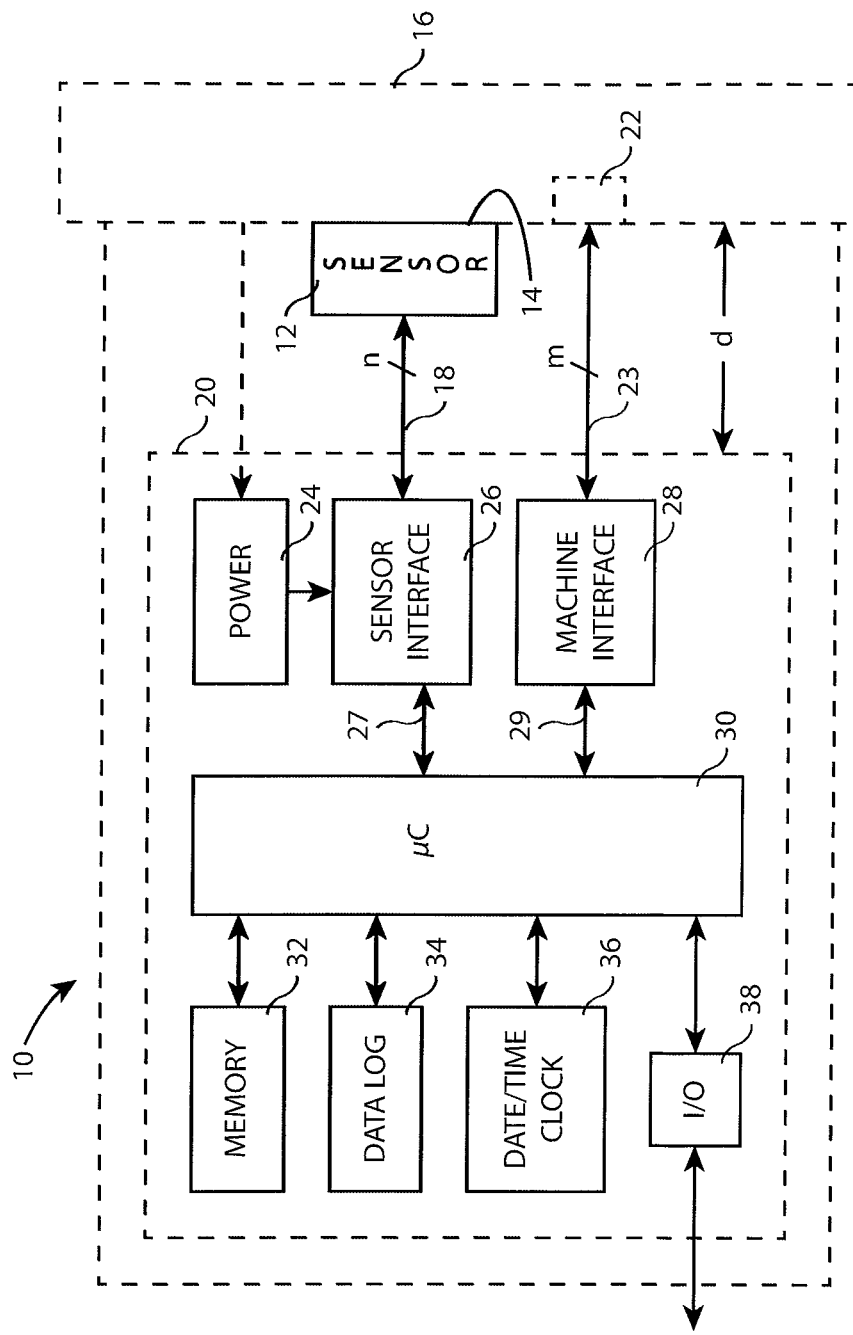
FIG. 1 is a block diagram of an example machine monitor and control system.

FIG. 1 is a block diagram of an example machine monitor and control system 10 including a vibration sensor 12 mechanically coupled by an elastomeric layer 14 to a machine 16, a n-line bus 18 coupled at a first end to the vibration sensor 12 and coupled at a second end to a monitoring and control unit 20 that is physically separated from the vibration sensor 12 by a distance "d". In this example, the vibration sensor 12 can include a three-axis, solid state MEMS accelerometer commercially available from a number of sources.

The machine 16 can be, by way of non-limiting example, an integrated circuit testing machine. For purposes of description, the n-line bus 18 in this non-limiting example includes at least a power line, a ground line, and an analog signal line. Machine 16, in this example, includes a machine interface port 22 that can be connected to the monitoring and control unit 20 by an m-bit bus 23. The actual configuration of the machine interface port 22 and the number of lines for the m-bit bus 23 is determined by the manufacturer of the machine 16, but m is typically greater than or equal to two.

The monitoring and control unit 20, in this non-limiting embodiment, includes a power source 24 coupled to the power line and the ground line of the n-bit bus 18 via a sensor interface 26. The sensor interface 26 also includes an analog-to-digital (A/D) converter having an analog input coupled to the analog signal line of the n-bit bus and having a digital signal output 27. The monitoring and control unit 20 also includes a machine interface 28 having a machine port coupled to the m-bit bus 23 and a digital port 29. A digital processor 30 is coupled to the digital signal output 27 of the sensor interface, to the digital port 29 of the machine interface, and to non-transitory computer readable media memory 32, which includes code segments executable on the digital processor 30 for sampling and storing the digital signal output of the sensor interface as vibration data, processing the vibration data, and developing a machine 16 control signal on the m-bit bus 23. The monitoring and control unit 20, in this non-limiting example, also includes a data log memory 34, a date/time clock 36 and an I/O interface 38 coupled to the processor 30. The data/time clock 36 can be used to generated date/time codes that are associated with vibration data stored in data log memory 34. The I/O interface can be used to communicate with external devices to provide data and information to users, control other machines, and to receive parameters such as threshold values, sampling rates, etc.

Figure 2:
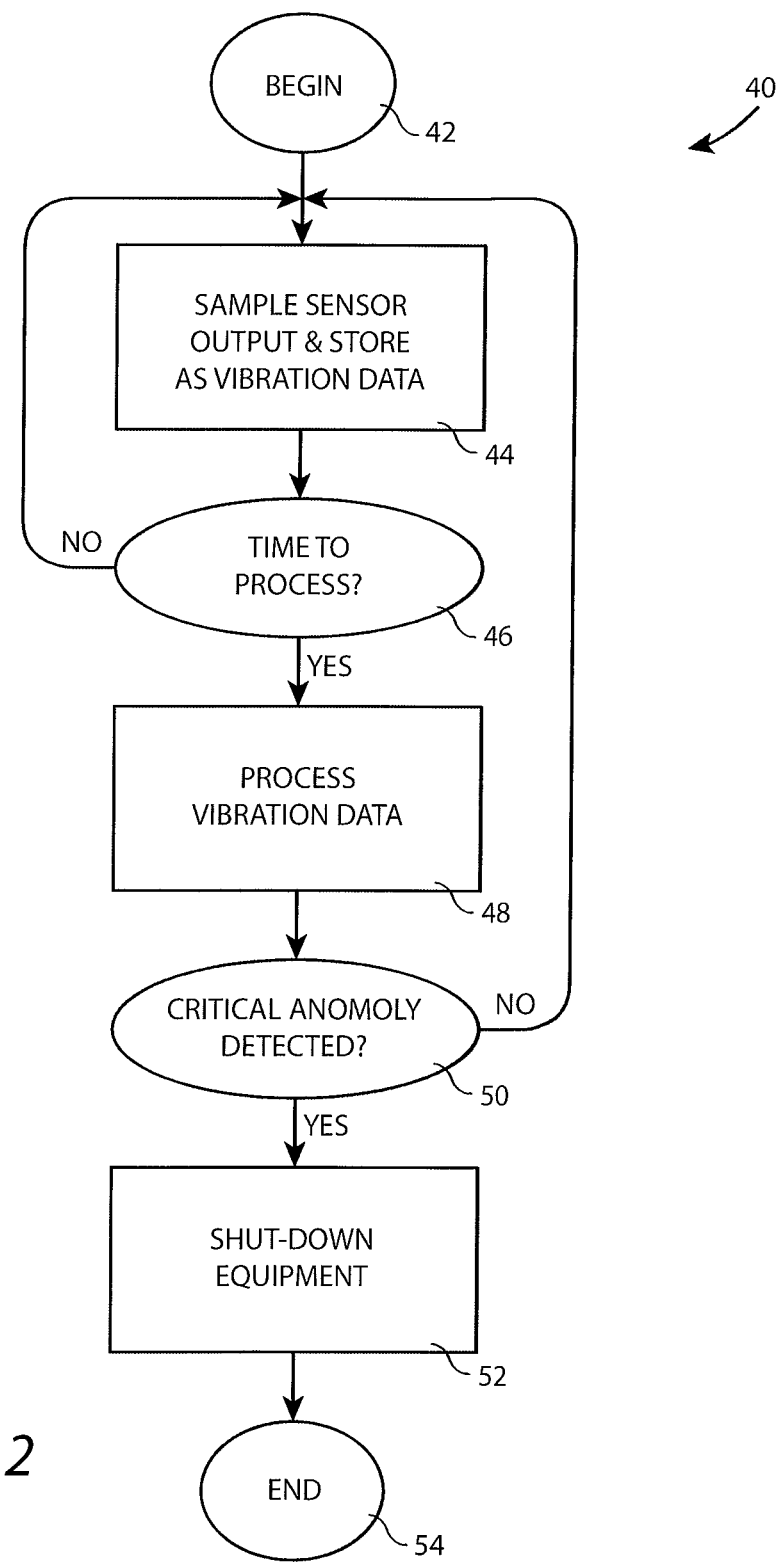
FIG. 2 is a flow diagram of an example process for monitoring and controlling a machine.

FIG. 2 is a flow diagram of an example process 40 for monitoring and controlling a machine. For the purpose of discussion, it will be assumed that the process 40 is implemented by the example machine monitor and control system 10 with respect to machine 16 of FIG. 1, it being understood that the process 40 can be implemented with alternative monitor and control systems and with other machines.

In this non-limiting example, process 40 begins at 42 with the powering-up of machine 16. Next, in an operation 44, an output of vibration sensor 12 is sampled and stored, e.g. in memory 32 and/or 34, as vibration data. Example sampling rates can be in the range of a few thousand hertz, e.g. 2750 kilohertz. An operation 46 determines if it time to process the vibration data. For example, the time to process the vibration window may be within a real-time window of 30, 10, 5 or 1 seconds. The actual time to process can vary depending upon the anomaly being detected, its period, etc. If it is not time to process the vibration data, process control is retuned to operation 44. Otherwise, the vibration data is processed at operation 38, and an operation 50 determines if a critical anomaly in the operation of the machine 16 has been detected. If not, operational control is returned to operation 44 and, if so, an operation 52 is used to shut-down the machine 16 via a command to machine interface port 22, and the process 40 ends at 54.

It will be appreciated that the process 40 can provide continuous, real-time monitoring and control of a powered-up machine. This allows actual (not predictive) detection of critical anomalies in the operation of the machine leading to automatic correction, e.g. reset, clear or power-down. In the context of the example of a handler, this means that damage to integrated circuits in the Final Test process can be both detected and minimized.

Figure 3:
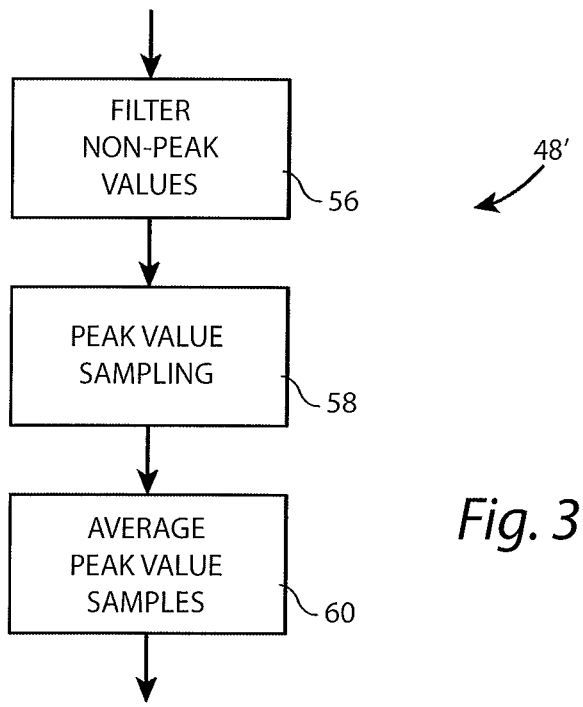
FIG. 3 is a flow diagram of an example process for implementing the "Process Multiple Stored Sensor Outputs" operation of FIG. 2.

FIG. 3 is a flow diagram of an example process 48' for implementing the "Process Multiple Stored Sensor Outputs" operation of FIG. 2. Process 48' includes an operation 56 which filters non-peak values from the vibration data, an operation 58 which samples the peak values of the vibration data, and an operation 60 which averages the peak value samples to develop a peak average value. With additional reference to FIG. 2, this peak average value can be compared to a threshold value in an operation 50, and if it exceeds the threshold value, a critical anomaly is detected.

It should be noted that the process 48' is heuristic in nature, having been derived by an observation of vibration data produced by various anomalous operating conditions of a handler. Other processes can also be used to detect critical anomalies, including those using machine learning and neural network techniques. Further, multiple techniques can be used to detect multiple critical anomalies, such as those produced by misalignment, jamming, loose screws, etc.

Figure 4:
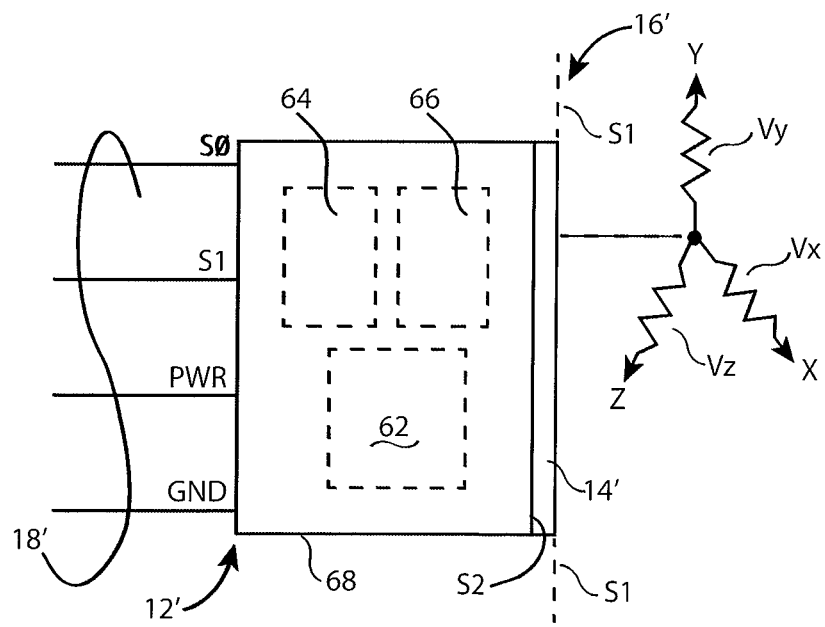
FIG. 4 is an illustration of an example vibration sensor mechanically coupled to a surface by an elastomeric layer.

FIG. 4 is an illustration of an example vibration sensor 12' mechanically coupled to a surface S1 of a machine 16' by an elastomeric layer 14'. A 4-line bus 18', set forth by way of example but not limitation, include a pair of analog signal lines S0 and S1, a power line PWR and a ground line GND.

In this non-limiting example, the vibration sensor 12' includes an accelerometer 62, an optional filter 64, and optional circuitry 66. The optional filter 64 can be made with passive components such as capacitors (C) and inductors (L), and active components of the vibration sensor 12' can be powered by the power line PWR. The vibration sensor 12' can be packaged within a case 68 having a surface S2 that is in contact with the elastomeric layer 14'. It is preferable that the case 68 be as small as possible, to allow for its placement inside of machines, or in otherwise difficult to access areas. For example, the case can be a square inch or less in area and a few millimeters thick.

The elastomeric layer 14' allows vibration components $V_X$, $V_Y$ and $V_Z$ of surface S1 of machine 16' to be transmitted to the surface S2 of the vibration sensor 12' in a loosely coupled manner, unlike the rigid, firm magnetic attachments of the prior art. By "elastomeric" it is meant that the material of the layer is an elastic substance such natural or synthetic rubber or other elastic materials which can resume their normal shape spontaneously after contraction, dilatation or distortion. In an example embodiment, the elastomeric layer is attached to surface S2 of the vibration sensor 12' by a suitable adhesive. In another example embodiment, the elastomeric layer 14' comes in the form of an adhesive tape, which can be single or double sided. The adhesive tape can be made from a number of elastomeric substances, including rubber, foam, etc. The vibrational coupling through the elastomeric material is dependent primarily on the type of elastomeric material used and the thickness of the layer. One effect of the elastomeric material is to dampen out noise, increasing the signal-to-noise ratio of the sensor.

FIG. 5 is an illustration of an example vibration sensor 12" mechanically coupled to a surface of a handler track 70 by an elastomeric layer 14" comprising a thick, two-sided adhesive tape. Also seen is an upper singulator 72 and a lower singulator 74. The singulators are used to allow one IC at a time to slide down the handler track 70. Operational anomalies can occur when one or more singulators jam, impact or otherwise damage ICs been fed to the tester by the handler.

FIGS. 6 and 7 are perspective and elevational views, respectively, of an example clamp 76, vibration sensor 12" and elastomeric layer 14" attached to the handler track 70 of FIG. 5. The clamp 76 includes a "C" shaped member 78 provided with a threaded aperture A through its base to accommodate an adjustment bolt 80. A lock nut 82 is provided to hold the adjustment bolt in place. Feet 86 of the C shaped member 78 engage flanges F of the track 70. A compression spring 84 is provided around the adjustment bolt 80 between the base of the C shaped member 78 and a surface of the vibration sensor 12". The spring 84 provides a compression force on the elastomeric layer 14", which can be adjusted with using the adjustment bolt 80. In the example of FIG. 6 the elastomeric layer 14" is relatively uncompressed ("loosely coupled") and in the example of FIG. 7 the elastomeric layer 14" is relatively compressed ("tightly coupled"). This arrangement allows for an adjustment of the vibration forces and noise transmitted through the elastomeric layer 14" to thereby allow an adjust of the signal-to-noise level input to the vibration sensor 12".

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A system for monitoring and controlling comprising:
   a vibration sensor adapted for mechanical communication with a surface of an integrated circuit (IC) testing machine to develop an electrical vibration signal at a sensor output representing mechanical vibrations generated by the IC testing machine as it is operated, wherein the mechanical communication comprises an elastomeric layer coupled to the vibration sensor and coupled to the surface of the IC testing machine;
   a sensor interface having an interface input coupled to the sensor output, the sensor interface being operative to process the vibration signal and to output vibration data on an interface output; and
   a processor coupled to the interface output and configured to:
      receive the vibration data,
      process the vibration data,
      determine, based on processing the vibration data, whether the vibration data is indicative of an anomaly being detected in operation of the IC testing machine, and
      generate, based on the anomaly being detected, a machine control signal configured to correct an operation of the IC testing machine.

2. The system of claim 1 and further comprising:
   a machine interface in electrical communication with the IC testing machine, the machine interface configured to receive the machine control signal and to correct an operation of the IC testing machine by at least one of resetting, clearing, shutting down, and powering down the IC testing machine.

3. The system of claim 1, wherein processing the vibration data comprises filtering non-peak values, sampling peak values, and averaging the sampled peak values.

4. The system of claim 1, wherein the vibration sensor comprises an accelerometer configured to sense acceleration along one or more axes.

5. The system of claim 1 and further comprising:
   an algorithm fixed in a non-transitory computer readable medium and executable by the processor, the algorithm configured to process the vibration data using at least one of a heuristic, machine learning or neural network technique.

6. A system for monitoring and controlling an integrated circuit testing machine, comprising:
   a vibration sensor adapted for mechanical communication with a surface of an integrated circuit (IC) testing machine to develop an electrical vibration signal at a sensor output representing mechanical vibrations generated by the IC testing machine as it is operated;
   a sensor interface having an interface input coupled to the sensor output, the sensor interface being operative to process the vibration signal and to output vibration data on an interface output; and
   a processor coupled to the interface output and configured to:
      receive the vibration data,
      process the vibration data,
      determine, based on processing the vibration data, whether the vibration data is indicative of an anomaly being detected in operation of the IC testing machine, and
      generate, based on the anomaly being detected, a machine control signal configured to correct an operation of the IC testing machine;
   wherein the vibration sensor is in mechanical communication with a handler apparatus of the IC testing machine.

7. A system for monitoring and controlling comprising:
   a plurality of vibration sensors having a plurality of sensor outputs, where each of the plurality of vibration sensors are adapted for mechanical communication with an integrated circuit (IC) testing machine to develop an electrical vibration signal at a respective one of the plurality of sensor outputs representing mechanical vibrations generated by the IC testing machine as it is operated;
   a sensor interface operative to process vibration signals and to output vibration data on an interface output; and
   a processor coupled to the interface output and configured to:
      receive the vibration data,
      process the vibration data,
      determine based on processing the vibration data, whether the vibration data is indicative of an anomaly being detected in operation of the IC testing machine, and
      generate, based on the anomaly being detected, a machine control signal configured to correct an operation of the IC testing machine;
   wherein at least one of the plurality of vibration sensors is in mechanical communication with a handler apparatus of the IC testing machine.

8. The system of claim 7 and further comprising:
   a machine interface in electrical communication with the IC testing machine, the machine interface configured to receive the machine control signal and to correct an operation of the IC testing machine by at least one of resetting, clearing, shutting down, and powering down the IC testing machine.

9. The system of claim 7 and further comprising:
   an algorithm fixed in a non-transitory computer readable medium executable by the processor, the algorithm configured to process the vibration data using at least one of a heuristic, machine learning or neural network technique.

10. The system of claim 7, wherein at least one of the plurality of vibration sensors comprises an accelerometer configured to sense acceleration along one or more axes.

11. The system of claim 7, wherein the plurality of vibration sensors are mechanically coupled to different portions of the IC testing machine.

12. The system of claim 7, wherein the machine control signal is generated during a selected one of testing of one or more integrated circuits (ICs) by the IC testing machine and operation of the IC testing machine without ICs being tested.

13. The system of claim 7, wherein the processor is configured to:
    determine a time to begin processing the vibration data, the time being within a vibration window that occurs during operation of the IC testing machine.

14. The system of claim 13, wherein the time depends on the anomaly being detected.

15. The system of claim 7 and further comprising:
    processing, using multiple algorithms fixed in a non-transitory computer readable medium executable by the processor, the vibration data from the plurality of vibration sensors to determine whether the vibration data is indicative of multiple anomalies being detected in operation of the IC testing machine.

16. The system of claim 7, wherein processing the vibration data comprises filtering non-peak values, sampling peak values, and averaging the sampled peak values.

17. A system for monitoring and controlling an integrated circuit testing machine, comprising:
    a plurality of vibration sensors having a plurality of sensor outputs, where each of the plurality of vibration sensors are adapted for mechanical communication with an integrated circuit (IC) testing machine to develop an electrical vibration signal at a respective one of the plurality of sensor outputs representing mechanical vibrations generated by the IC testing machine as it is operated;
    a sensor interface operative to process the vibration signals and to output vibration data on an interface output; and
    a processor coupled to the interface output and configured to:
        receive the vibration data,
        process the vibration data from the plurality of vibration sensors to determine whether the vibration data is indicative of multiple anomalies being detected in operation of the IC testing machine using multiple algorithms fixed in a non-transitory computer readable medium,
        determine based on processing the vibration data, whether the vibration data is indicative of an anomaly being detected in operation of the IC testing machine, and
        generate, based on the anomaly being detected, a machine control signal configured to correct an operation of the IC testing machine;
    wherein the multiple anomalies comprise a selected one or more of misalignment, jamming and a loose fastener.

* * * * *